United States Patent
Liu et al.

(10) Patent No.: US 8,012,839 B2
(45) Date of Patent: Sep. 6, 2011

(54) METHOD FOR FABRICATING A SEMICONDUCTOR DEVICE HAVING AN EPITAXIAL CHANNEL AND TRANSISTOR HAVING SAME

(75) Inventors: Jinping Liu, Singapore (SG); Alex K H See, Singapore (SG); Mei Sheng Zhou, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 286 days.

(21) Appl. No.: 12/040,562

(22) Filed: Feb. 29, 2008

(65) Prior Publication Data
US 2009/0218597 A1  Sep. 3, 2009

(51) Int. Cl.
*H01L 21/336* (2006.01)

(52) U.S. Cl. ............... 438/300; 438/299; 257/E21.093; 257/E21.43; 257/E21.431

(58) Field of Classification Search .......... 438/212, 438/229, 268, 282, 299, 300; 257/E21.097, 257/E21.093, E21.115, E21.429, E21.43, 257/E21.431
See application file for complete search history.

(56) References Cited

U.S. PATENT DOCUMENTS

| | | | |
|---|---|---|---|
| 5,661,085 A * | 8/1997 | Teong | 438/653 |
| 6,972,461 B1 | 12/2005 | Chen et al. | |
| 7,556,996 B2 * | 7/2009 | Schwan et al. | 438/199 |
| 2004/0029320 A1 * | 2/2004 | Chong et al. | 438/142 |
| 2005/0085022 A1 * | 4/2005 | Chidambarrao et al. | 438/151 |
| 2005/0205932 A1 | 9/2005 | Cohen | |
| 2006/0128105 A1 | 6/2006 | Ouyang et al. | |
| 2008/0020515 A1 * | 1/2008 | White et al. | 438/118 |
| 2008/0042219 A1 * | 2/2008 | Booth et al. | 257/401 |

OTHER PUBLICATIONS

Donaton, et al., Design and Fabrication of MOSEFETs with a Reverse Embedded SiGe (Rev. e-SiGe) Structure, IEEE, 2006.
Liu, et al., Implant damage and strain relaxation of embedded epitaxial silicon germanium layer on silicon, Applied Physics Letters, 90 261915, American Institute of Physics 2007.
Wormington, et al. "Asymmetric Relaxation of SiGe in Patterned Si Line Structures," VLSI Metrology Meeting, 2007.

* cited by examiner

*Primary Examiner* — Michael S Lebentritt
*Assistant Examiner* — Daniel Whalen
(74) *Attorney, Agent, or Firm* — Brinks Hofer Gilson & Lione (57) ABSTRACT

A transistor having an epitaxial channel and a method for fabricating a semiconductor device having an epitaxial channel, the method including forming a hardmask on a substrate and forming an opening in the hardmask. The opening is geometrically characterized by a long dimension and a short dimension, and the opening is arranged in a predetermined manner relative to the channel region of a transistor. An epitaxial material is formed in the opening that induces strain in substrate regions proximate to the epitaxial material. The epitaxial material is confined to the opening, such that an epitaxial channel is formed. A transistor is fabricated in proximity to the epitaxial channel, such that the strain induced in the substrate provides enhanced transistor performance. By confining the epitaxial material to a predefined channel in the substrate, plastic strain relaxation of the epitaxial material is minimized and a maximum amount of strain is induced in the substrate.

7 Claims, 6 Drawing Sheets

METHOD FOR FABRICATING A SEMICONDUCTOR DEVICE HAVING AN EPITAXIAL CHANNEL AND TRANSISTOR HAVING SAME

RELATED APPLICATION

Related subject matter is disclosed in co-pending, commonly-assigned patent application Ser. No. 11/844,074, filed Aug. 23, 2007, the disclosure of which is incorporated by reference herein.

TECHNICAL FIELD

The present invention relates, generally, to semiconductor devices and device fabrication and, more particularly, to the fabrication of semiconductor devices having hetero-epitaxially induced strain in the active device regions.

BACKGROUND

As integrated circuits are scaled to smaller and smaller dimensions, continued improvement in device drive current is necessary to maintain optimum transistor performance. In a metal-oxide-semiconductor (MOS) transistor, drive current is determined, in part, by gate length, gate capacitance, and carrier mobility. At a given device size, improved device current can be obtained by increasing the carrier mobility. A widely-used technique to enhance carrier mobility includes inducing strain in the active regions of the MOS transistors. Strain or stress in the crystalline lattice of the transistor substrate can enhance bulk electron and hole mobility through the crystalline lattice.

A common practice used to create strain, or stress, in a crystalline substrate is to form a layer of material in the substrate that has a lattice constant that differs from the substrate material. For example, strain can be induced in devices formed in a single crystal silicon substrate by forming regions of silicon germanium (SiGe) or silicon carbide (SiC). Since the lattice constant of SiGe is larger than that of silicon, the lattice mismatch puts the silicon under tension and the charge carrier mobility increases through the strained silicon lattice. Similarly, the lattice constant of SiC differs from silicon, however, the type of strain created by SiC differs from that created by SiGe. Alloys such as SiGe create compressive strain in silicon, while SiC creates tensile strain in silicon. A bi-axial, in-plane tensile strain field can improve performance in N-type MOS devices, and compressive strain can improve performance in P-type MOS devices. Further, other materials can be used to create strain in semiconductor substrates depending upon the particular substrate material and its lattice constant. For example, hetero-epitaxial processes can be used to form a wide range of materials, such as germanium (Ge) and silicon (Si) in III-IV substrates.

The fabrication of substrates having hetero-epitaxial regions is generally coupled with the use of advanced transistor materials to fabricate MOS devices having exceedingly small feature sizes. For example, such technology is employed to fabricate MOS devices having gate lengths on the order of 45 nm with continued scaling to 22 nm. Although hetero-epitaxial substrate regions and advanced materials technology are useful for the fabrication of extremely small devices, typical epitaxial processes produce large regions of epitaxial material. Such large area epitaxy can limit the fabrication of devices having feature sizes considerably less than 45 nm. A particular problem encountered with large area epitaxial deposition concerns plastic strain relaxation that takes place in the bulk epitaxial material. The relaxation reduces the difference in lattice constant between the epitaxial material and the substrate, which, in turn, reduces the strain imparted to the crystalline substrate.

Accordingly, improved technology is necessary for the utilization of hetero-epitaxial materials for the fabrication of transistor devices having extremely small feature sizes.

SUMMARY

In one embodiment, a method for fabricating a transistor characterized by a channel length and a channel width includes forming a hardmask overlying a substrate, and forming an opening in the hardmask. An epitaxial region is formed in the opening. A gate dielectric layer is formed overlying the epitaxial region and a gate electrode is formed overlying the gate electrode.

In another embodiment, a method for fabricating a semiconductor device includes forming a gate structure having sidewall spacers on a substrate. The gate structure is removed, exposing a channel region of the substrate that is defined by the sidewall spacers. An epitaxial region is selectively formed on the channel region. A gate dielectric layer is formed overlying the epitaxial region and a gate electrode is formed overlying the gate dielectric layer.

In yet another embodiment, a method for fabricating a semiconductor device includes forming a hardmask overlying a substrate. An opening is formed in the hardmask that has a long dimension and a short dimension. An epitaxial region is formed in the opening. A gate dielectric layer is formed overlying the epitaxial region and a gate electrode is formed overlying the gate dielectric layer. The gate electrode has a long dimension substantially orthogonal to the long dimension of the opening.

In still another embodiment, a transistor includes a crystalline substrate having a epitaxial channel therein, the channel having a long dimension and a short dimension. An epitaxial material resides in the epitaxial channel and a gate dielectric layer overlies the epitaxial material. A gate electrode overlies the gate dielectric layer and defins a transistor channel region in the substrate beneath the gate electrode. The transistor channel region has a channel length oriented in a predetermined relationship to the long dimension of epitaxial channel.

DETAILED DESCRIPTION

Figure 1:
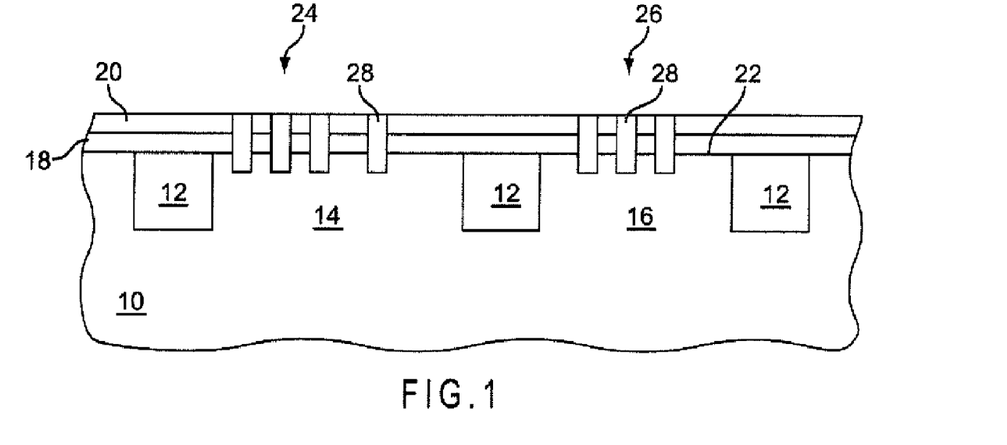
FIGS. 1-3 illustrate, in cross-section, processing steps in accordance with one embodiment of the invention.

FIG. 1 illustrates a cross-sectional view of a substrate 10 having already undergone several processing steps in accordance with the invention. In the illustrative embodiment, substrate 10 includes shallow trench isolation regions 12 in which an insulating material, such as silicon oxide, is formed in trenches etched into substrate 10. The trench isolation regions define active regions in substrate 10, such as active regions 14 and 16. Hardmask layers 18 and 20 are formed overlying a principle surface 22 of substrate 10. A plurality of openings 24 and 26 are formed in hardmask layers 18 and 20, and the openings are filled with an epitaxial material 28.

Figure 2:
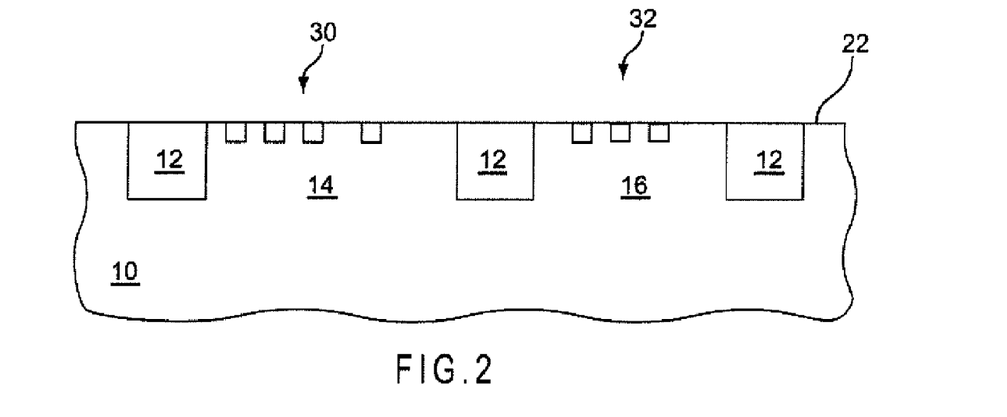

After forming epitaxial material 28, hardmask layers 18 and 20 are removed and a planarization process is carried out to form epitaxial channels 30 in active region 14 and epitaxial channel 32 in active region 16.

The exemplary process illustrated in FIGS. 1 and 2 provides a substrate having epitaxial regions confined to channels formed in active regions of the substrate. By fabricating epitaxial channels in the substrate, strain is induced in the substrate by a lattice mismatch between the epitaxial material in the channels and the surrounding crystalline substrate. The confinement of the epitaxial material to predefined channels in the substrate limits plastics strain relaxation of the epitaxial material, such that a maximum amount of strain is induced in the substrate and the strain is maintained during subsequent device fabrication steps. As will subsequently be described, fabrication of epitaxial channels in a device substrate provides a substrate upon which highly integrated transistors can be fabricated to extremely small channel lengths, while avoiding the problems of bulk epitaxial regions encountered in the prior art.

Those skilled in the art will appreciate that the materials constituting substrate 10, hardmask layers 18 and 20, and epitaxial material 28 can vary depending upon the particular type of semiconductor device under fabrication. For example, substrate 10 can be a single-crystalline substrate composed of silicon, germanium, III-V materials, and the like. Further, hardmask layers 18 and 20 can be a variety of materials having differential etching characteristics sufficient to enable lithographic patterning and etching for the formation of openings in the hardmask layers and channels in substrate 10. For example, hardmask layers 18 and 20 can be dielectric materials, such as silicon oxide, silicon nitride, silicon oxy nitride, and the like. Further, epitaxial material 28 can vary depending upon the crystalline composition of substrate 10. For example, where substrate 10 is single crystal silicon, epitaxial material 28 is preferably silicon germanium (SiGe), or silicon carbide (SiC) depending upon the conductivity type of transistors to be formed in active regions 14 and 16. Further, epitaxial material 28 can be silicon and germanium or a III-V semiconductor material. Epitaxial material 28 can be any material that has a lattice constant that differs from the lattice constant of substrate (10) by an amount sufficient to induce strain in the substrate.

In addition to variations in material compositions, a variety of fabrication techniques can be employed to carry out the processing steps illustrated in FIGS. 1 and 2. For example, a lithographic mask pattern can be formed on hardmask layer 20 and an etching processing carried out to form openings 24 and 26. For example, anisotropic plasma etching processes can be used in which the plasma chemistry is selected to etch the particular materials of hardmask layers 18 and 20 in substrate 10. Further, multi-stage processing techniques can be used in which the various layers are etched in different plasma etching chambers.

Those skilled in the art will appreciate that various conventional etching processes are readily available to selectively etch substrate 10, while not appreciably etching hardmask layers 18 and 20. Further, although two separate hardmask layers are illustrated in FIG. 1, additional layers, such as antireflective layers, and the like can also be formed. Moreover, a single hardmask layer can also be employed to provide a layer upon which lithographic patterning and plasma etching can be carried out.

Figure 3:
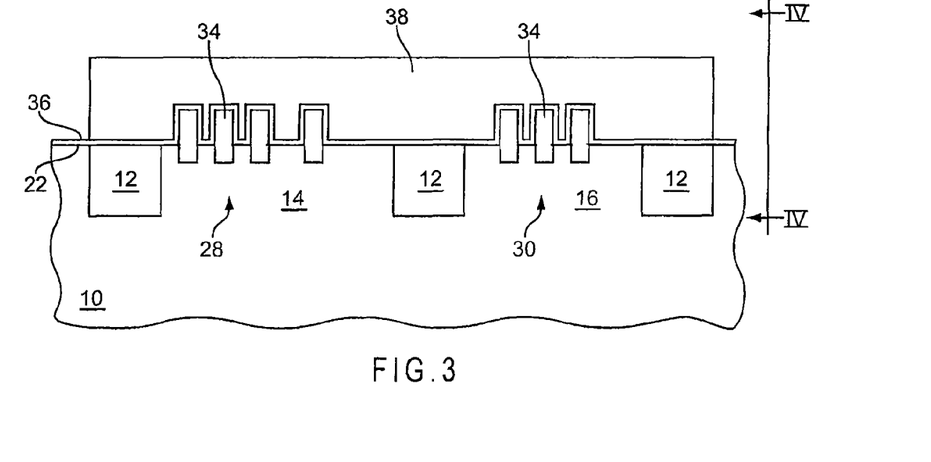
Figure 4:
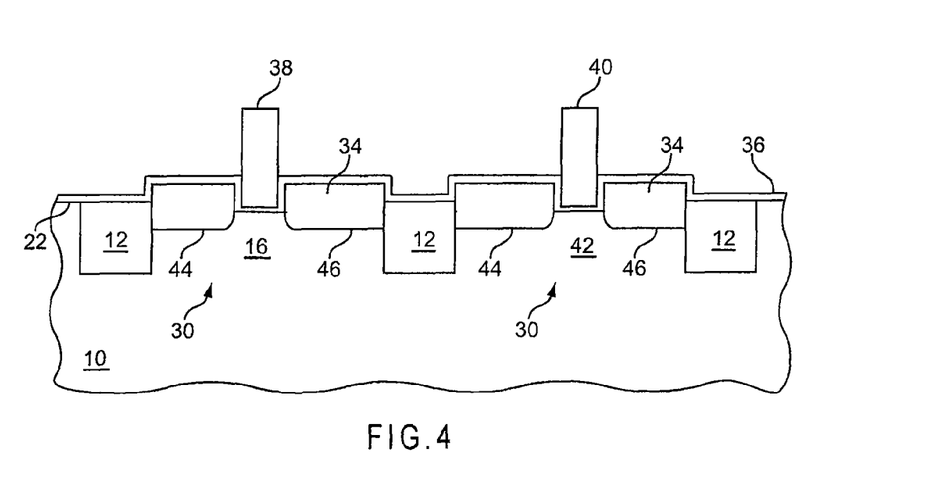
FIG. 4 is a view of the structure illustrated in FIG. 3 taken from view angle IV-IV.

One exemplary embodiment of transistor fabrication on substrate 10 is illustrated in FIGS. 3 and 4. In the illustrated embodiment, rather than planarize the substrate as illustrated in FIG. 2, once openings 24 and 26 are filled with epitaxial material, hardmask layers 18 and 20 are removed, leaving epitaxial pillars 34 protruding above principal surface 22. Epitaxial pillars 34 are formed by selectively etching away hardmask layers 18 and 20 while not substantially etching epitaxial material 28.

Once hardmask layers 18 and 20 are removed, a gate dielectric layer 36 is formed on principal surface 22 and on the exposed surfaces of epitaxial pillars 34. Then, a gate electrode 38 is formed on gate dielectric layer 36. The view illustrated in FIG. 4 is taken at a right angle to the view illustrated in FIG. 3 along direction IV-IV. A second gate electrode 40 is shown in FIG. 4 that is formed in an adjacent active region 42 of substrate 10. Gate electrodes 30 and 40 span across epitaxial regions 34 in a direction generally orthogonal to the direction of epitaxial channels 28 and 30.

Figure 5:
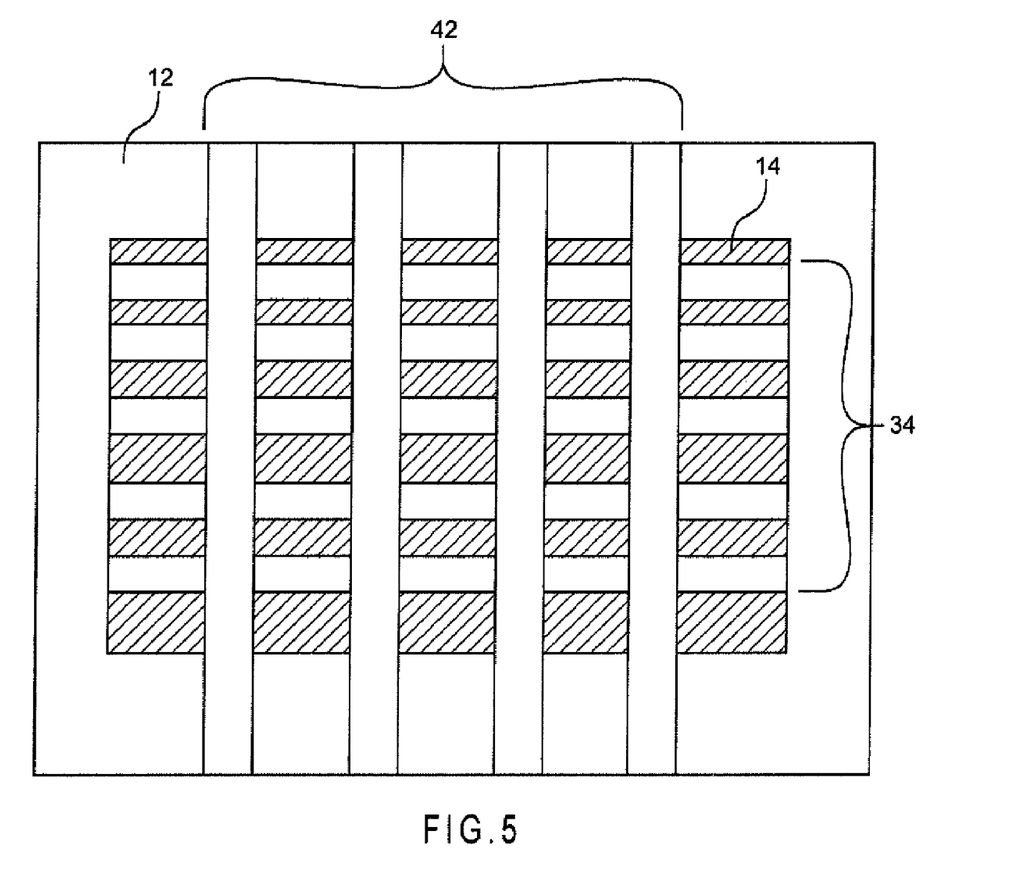
FIG. 5 is a schematic diagram illustrating an arrangement of epitaxial channels and gate electrodes in accordance with an embodiment of the invention.

A plain view showing the orthogonal arrangement of epitaxial channels and gate electrodes is illustrated in FIG. 5. Isolation region 12 bounds active region 14. Epitaxial channels 28 span across active region 14 within isolation region 12. A plurality of gate electrodes 42 are orthogonally arrayed across active region 14 and isolation region 12.

Those skilled in the art will appreciate that the orthogonal arrangement of the gate electrodes and the epitaxial channel provides a device structure that can be fabricated without a critical alignment of the gate electrode to the epitaxial channel. In the embodiment illustrated in FIG. 5, the epitaxial channels extend along the width direction of the transistor channels. Accordingly, the gate electrodes can be positioned independent of the location of the epitaxial channels. The orthogonal arrangement advantageously provides channels that confine hetero-epitaxial strain inducing regions within the channels and that enable the formation of transistors having extremely small gate lengths, while not requiring high-precision critical lithographic alignment methods. As illustrated in FIG. 4, source and drain regions 44 and 46, respectively, are aligned with gate electrodes 38 and 40, while epitaxial pillars 34 extend along the width direction of the transistor channels.

The process embodiment described above and illustrated in FIGS. 1-5 can be employed to fabricate a wide variety of transistor types, including conventional MOS transistors, or vertically oriented transistors, such as FINFETs, and the like. The epitaxial region is confined to a channel having a long dimension in the transistor channel length direction and a short dimension in the transistor channel width direction.

Figure 6:
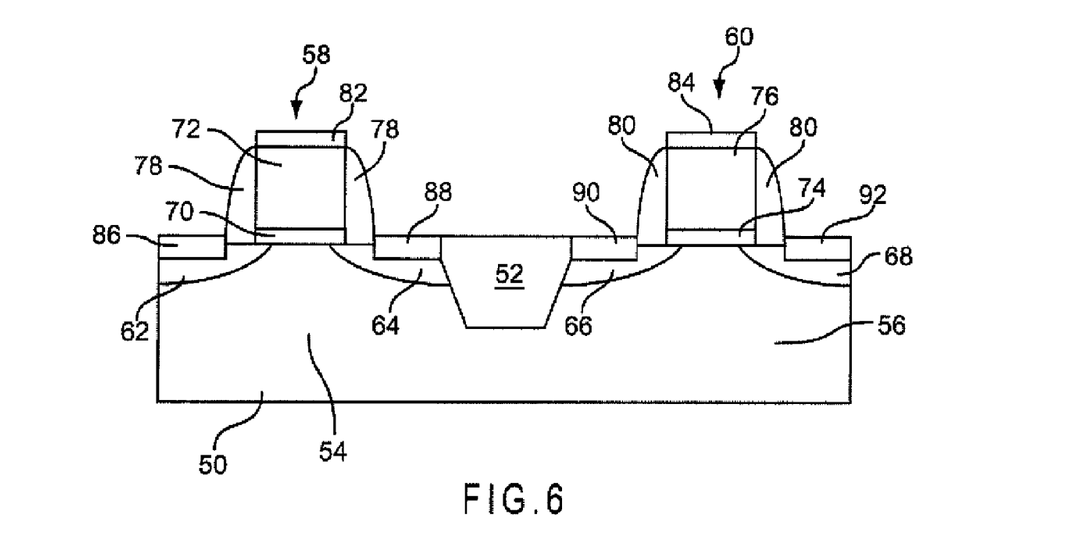
FIGS. 6-9 illustrate, in cross-section, processing steps in accordance with an alternative embodiment of the invention.

An alternative process embodiment in which an epitaxial channel is self-aligned with an overlying gate electrode is illustrated in FIGS. 6-9. FIG. 6 illustrates two adjacent device structures having already undergone several processing steps in accordance with the alternative embodiment. A substrate 50 includes a shallow trench isolation region 52 separating adjacent active regions 54 and 56. A gate structure 58 is formed over active region 54 and a second gate structure 60 is formed over active region 56. Source and drain regions 62 and 64 are formed in substrate 50 on either side of gate structure 58. Similarly, source and drain regions 66 and 68 are formed in substrate 50 on either side of gate structure 60. A dielectric layer 70 separates a gate body 72 from active region 54 of substrate 50, and a dielectric layer 74 separates a gate body 76 from active region 56 of substrate 50. Sidewalls spacers 78 are formed adjacent to the sides of gate body 72 and sidewall spacers 80 are formed adjacent to the sides of gate body 76. Capping layer 82 overlies gate body 72 and a capping layer 84 overlies gate body 76. Further, contact layers 86 and 88 are formed at the surface of substrate 50 on either side of sidewall spacers 78, and contact layers 90 and 92 are formed at the surface of substrate 50 adjacent either sidewall spacers 80.

Those skilled in the art will recognize the device structure illustrated in FIG. 6 as corresponding to conventional MOS transistors formed in adjacent active regions of a semiconductor substrate. The source and drain regions, dielectric layers, sidewall spacers, capping layers, and contact layers can all be formed by conventional materials and process techniques.

Figure 7A:
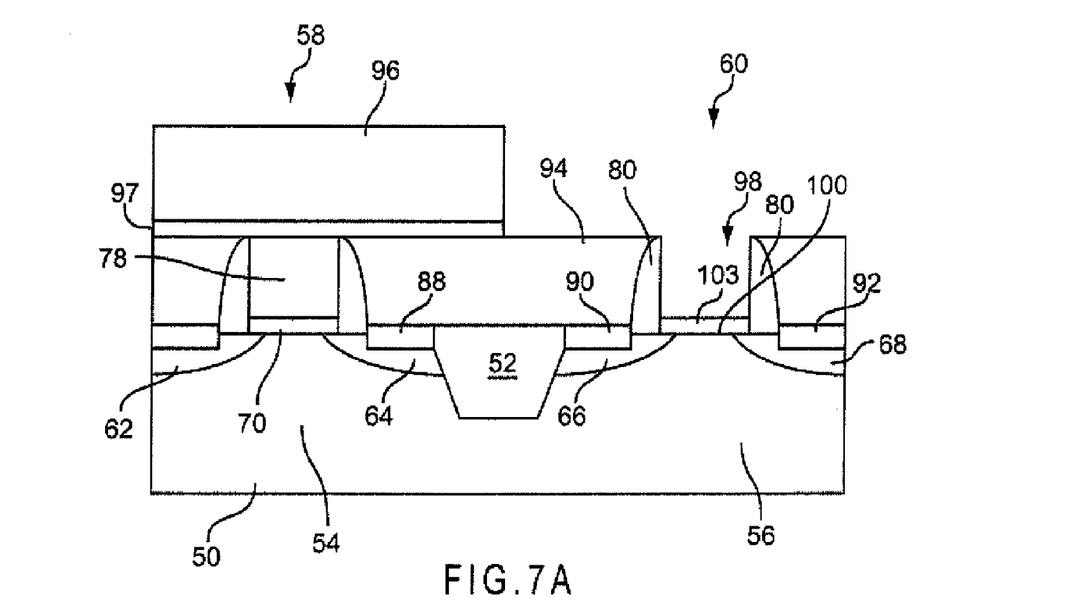

After forming gate structures 58 and 60, a planarization layer 94 is formed over substrate 50 and gate structures 58 and 60, as illustrated in FIG. 7A. Planarization layer 94 can be formed by depositing a layer of material and planaraizing the material using a planarization process such as nonselective sputter etching, chemical-mechanical-polishing (CMP), and the like. Then, a lithographic pattern 96 is formed on the surface of planarization layer 94, and an etching process is carried out to selectively remove capping layer 84 and gate body 76 from gate structure 20. An optional antireflective layer 97 can be formed on planarization layer 94 before depositing the lithographic material used to form lithographic patter 96. In one embodiment, the etching process forms a channel 98 defined by sidewall spacers 80 and a surface portion 100 of substrate 50. Preferably, an etching process is carried out that does not substantially etch sidewall spacers 80 or planarization layer 94. Where gate bodies 72 and 76 are a semiconductor material, the etching parameters are chosen to selectively react with semiconductor material, while not appreciably reacting with the materials forming substrate 50, sidewall spacers 80, or planarization layer 94.

Figure 7B:
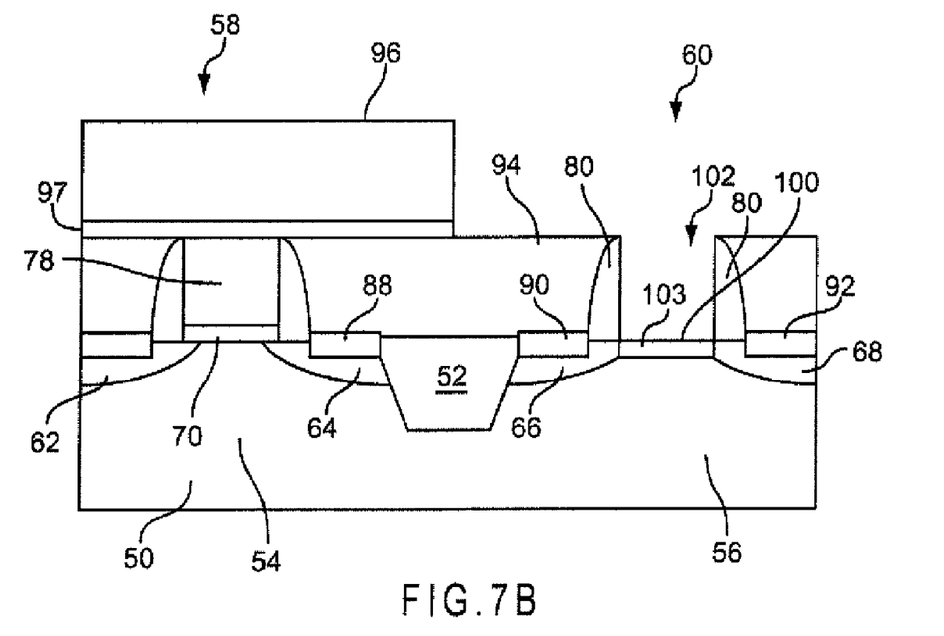

In an alternative process method illustrated in FIG. 7B, the etching process is carried out to form a channel 102. Channel 102 is defined by sidewall spacers 80 and also includes a recess 104 etched into substrate 50. In accordance with the alternative method, an etching process is used that reacts with the material of gate body 76, dielectric layer 74, and the material substrate 50.

Figure 8:
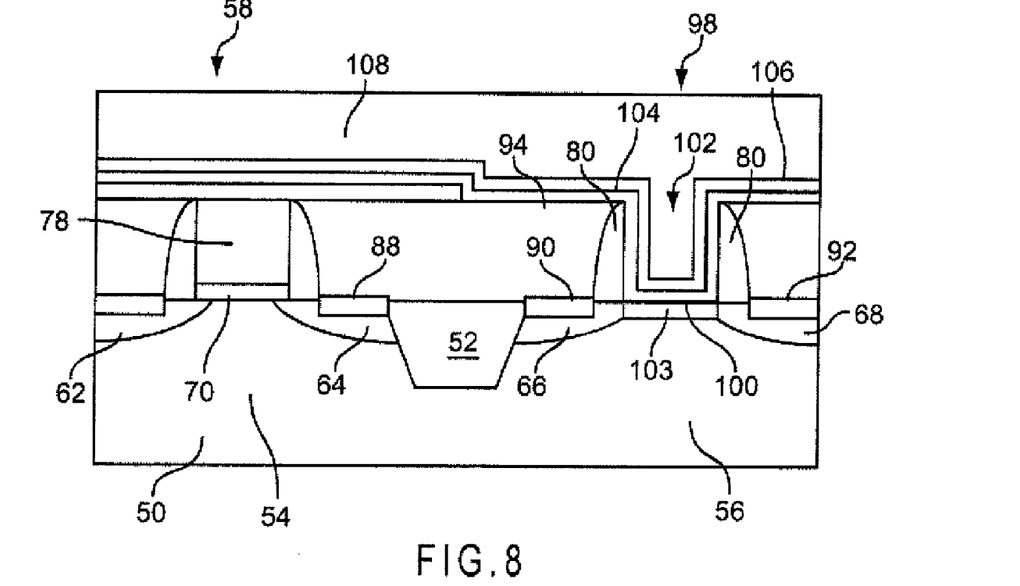

After informing channel 98 or 102, an epitaxial deposition process is carried out to form an epitaxial layer 103 in the lower portion of channel 98, or 102. As in the previous embodiment, a variety of epitaxial materials can be deposited depending upon the particular crystalline composition of substrate 50. The epitaxial layer 103 has a lattice constant that differs from the material of substrate 50, such that strain is induced in regions of substrate 50 and proximity to epitaxial layer 103.

In the inventive process, advance materials technology can be employed for fabrication, as needed for the fabrication of transistors having extremely small gate lengths. For example, the gate electrodes can be formed from a refractory metal, refractory metal silicide, a combination of metals and metal alloys, and the like. Further, the gate dielectric layers can be ceramic materials in addition to silicon oxide, silicon nitride, silicon oxynitride, and the like. In one particular method, once gate body 76 is removed and either channel 98 or 102 is formed, lithographic pattern 96 is removed and a high-K composite dielectric layer 104 is conformably deposited to overlie planarization layer 94, the inner surfaces of sidewall spacers 80, and substrate surface portion 100. Then, a metal gate material 106 is conformably deposited to overlie the high-K dielectric layer 104. Then, a fill material 108 is deposited to overlie metal gate material 106 and fill channel 98. Those skilled in the art will appreciate that various high-K dielectric materials, such as ceramic materials, and the like, can be conformably deposited to form a high-K dielectric layer. Further, various metals, such as refractory metals, refractory metal silicides, and the like, can be conformably deposited to form metal gate material 106.

Figure 9:
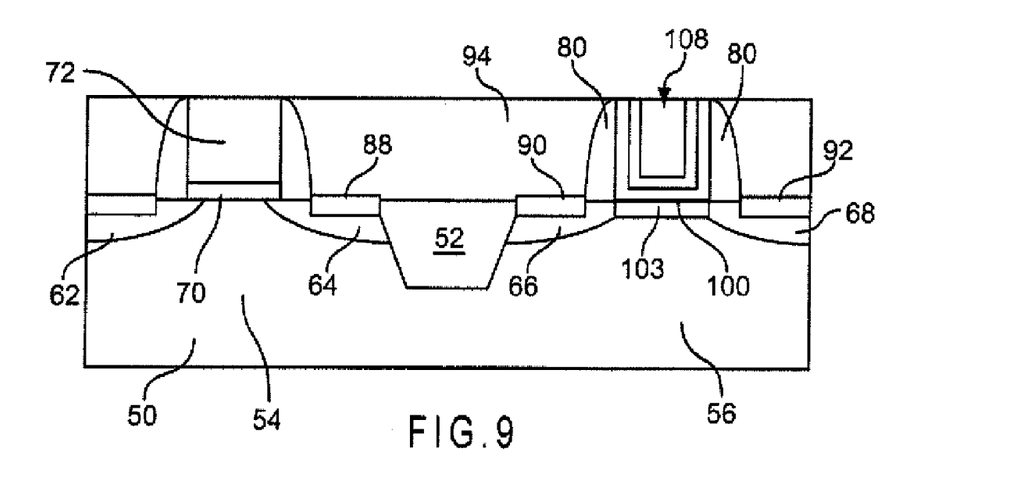

Once the high-K dielectric material and metal gate material is deposited, a planarization process is carried out to complete the formation of a gate electrode 108. For example, a CMP process can be used to remove fill material 108 and form the upper surface of gate electrode 108 in planar alignment with planarization layer 94.

In accordance with one aspect of the invention, the process steps described above and illustrated in FIGS. 6 through 9 can be carried out to remove gate body 72 and form a gate electrode having an epitaxial material in proximity to the channel region. For example, in the fabrication of complimentary-MOS devices (CMOS) P-channel and N-channel transistors are formed on the same substrate. Accordingly, the inventive process steps can be carried out to form an N-type transistor and a P-type transistor in an adjacent active region. Those skilled in the art will appreciate that the fabrication of N-type and P-type transistors requires the use of dopants having opposite conductivity types. Further, the particular materials used to fabricate the gate electrodes can vary or, alternatively, can be doped with different conductivity-type dopants depending upon the conductivity of the transistor.

In a further alternative embodiment, gate structures 58 and 60 can be processed simultaneously to fabricate gate electrodes in active regions 54 and 56. Regardless of the particular process embodiment carried out, the inventive process forms an epitaxial region in a channel that is self-aligned with the channel region of the transistor This relationship is in contrast to the embodiment illustrated in FIGS. 1-5, in which the long dimension of the channel is formed in a transistor channel length direction, and the short dimension of the epitaxial channel is formed in the transistor channel width direction.

Thus, it is apparent that there has been described a method of fabricating a semiconductor having an epitaxial channel that fully provides the advantages set forth above. Those skilled in the art will appreciate that numerous variations and modifications can be made without departing from the spirit of the invention. For example, a wide variety of processing techniques, such as plasma enhanced chemical-vapor-deposition, physical-vapor-deposition, molecular beam deposition, x-ray lithography, deep UV lithography, and the like can be used. Accordingly, all such variations and modifications are included within the appended claims and equivalents thereof.

The invention claimed is:

1. A method for fabricating a transistor, the transistor characterized by a channel length and a channel width, the method comprising:
providing a substrate having an active substrate region defined by isolation regions, the active region defined by a lateral channel length direction and a lateral channel width direction substantially orthogonal to the lateral channel length direction;
forming a hardmask overlying the substrate and forming an opening in the hardmask exposing a portion of the active substrate region;
forming an epitaxial region in the opening spanning the active substrate region and projecting above the substrate, the epitaxial region having a relatively long lateral dimension in the channel length direction and a relatively short lateral dimension in the channel width direction, wherein a lattice constant of the epitaxial region differs from a lattice constant of the substrate, such that strain is induced in regions of the substrate proximal to the epitaxial region;

forming a gate dielectric layer overlying the epitaxial region; and forming a gate electrode strip overlying the gate dielectric layer, the gate electrode strip having a relatively long lateral dimension substantially orthogonal to the relatively long lateral dimension of the epitaxial region.

2. The method of claim 1, wherein forming a hardmask comprises forming a dielectric layer overlying the substrate.

3. The method of claim 2 further comprising forming a recess in the substrate defined by the opening, wherein forming an epitaxial region in the opening comprises at least filling the recess.

4. The method of claim 3 further comprising removing the hardmask prior to forming the gate dielectric layer.

5. A method for fabricating a semiconductor device, the method comprising:
   providing a substrate having an active substrate region defined by isolation regions, the active region further defined by a lateral channel length direction and a lateral channel width direction substantially orthogonal to the lateral channel length direction;
   forming a hardmask overlying the substrate and forming an opening in the hardmask exposing a portion of the active substrate region;
   forming a recess in the substrate defined by the opening;
   forming an epitaxial pillar region in the recess spanning the active substrate region, the epitaxial pillar region having a relatively long lateral dimension in the channel length direction and a relatively short lateral dimension in the channel width direction,
   wherein a lattice constant of the epitaxial pillar region differs from a lattice constant of the substrate, such that strain is induced in regions of the substrate proximal to the epitaxial pillar region;
   removing the hardmask and leaving a portion of the epitaxial pillar region projecting above the substrate;
   forming a gate dielectric layer overlying the epitaxial pillar region; and
   forming a gate electrode strip overlying the gate dielectric layer, the gate electrode having a relatively long lateral dimension substantially orthogonal to the relatively long lateral dimension of the epitaxial pillar region.

6. The method of claim 5, wherein forming an epitaxial pillar region in the opening comprises at least filling the recess.

7. The method of claim 5, wherein forming an epitaxial pillar region comprises epitaxially forming silicon and germanium, a silicon germanium alloy, or a III-V semiconductor material.

* * * * *

UNITED STATES PATENT AND TRADEMARK OFFICE
CERTIFICATE OF CORRECTION

| | | |
|---|---|---|
| PATENT NO. | : 8,012,839 B2 | Page 1 of 1 |
| APPLICATION NO. | : 12/040562 | |
| DATED | : September 6, 2011 | |
| INVENTOR(S) | : Jinping Liu et al. | |

It is certified that error appears in the above-identified patent and that said Letters Patent is hereby corrected as shown below:

On the Title Page

Item (73) replace "Chartered Semiconductor Manufacturing, Ltd."

with --"GLOBALFOUNDRIES Singapore Pte. Ltd., Woodlands, Singapore (SG)"--

Signed and Sealed this
Twenty-ninth Day of April, 2014

Michelle K. Lee
*Deputy Director of the United States Patent and Trademark Office*